United States Patent

Horiya et al.

Patent Number: 5,514,332
Date of Patent: May 7, 1996

[54] TITANIUM FOR CONDUCTOR CONDUIT IN SUPERCONDUCTING COIL

[75] Inventors: Takao Horiya; Shigeru Ohkita, both of Futtsu; Toshiaki Nishida; Hirofumi Yoshimura, both of Hikari; Naoomi Yamada; Masayuki Yamamoto, both of Tokyo; Hideo Nakajima; Toshinari Andou, both of Naka, all of Japan

[73] Assignees: Nippon Steel Corporation; Japan Atomic Energy Research Institute, both of Tokyo, Japan

[21] Appl. No.: 162,077
[22] PCT Filed: Apr. 12, 1993
[86] PCT No.: PCT/JP93/00463
§ 371 Date: May 16, 1994
§ 102(e) Date: May 16, 1994
[87] PCT Pub. No.: WO93/21354
PCT Pub. Date: Oct. 28, 1993

[30] Foreign Application Priority Data

Apr. 13, 1992 [JP] Japan .................... 4-93155

[51] Int. Cl.$^6$ ............................. C22C 14/00
[52] U.S. Cl. ........................ 420/417; 148/421
[58] Field of Search ................. 420/417; 148/421

[56] References Cited

FOREIGN PATENT DOCUMENTS 3-250705  11/1991  Japan .
4-26743   1/1992   Japan .

OTHER PUBLICATIONS

The Nikkankogyo Shimbunsha Ltd., "Titanium Metal and Its Application", pp. 42–45 and 160–161, Dec. 15, 1983.

Primary Examiner—Scott Kastler
Attorney, Agent, or Firm—Wenderoth, Lind & Ponack

[57] ABSTRACT

Titanium having a thermal shrinkage factor close to that of $Nb_3Sn$ superconducting wire, whereby it gives rise to little degradation of the properties of the superconducting wire and also offers a good balance between strength and toughness at liquid helium temperature, making it highly suitable as a conduit pipe material used as a seal for liquid helium for high-magnetic-field superconducting coil applications. The present invention focusses on the major effect on strength and toughness of titanium material that the oxygen content has, and appropriately controls the oxygen and other impurities content of pure titanium to provide titanium material comprising, in mass %, 0.07 to 0.13 percent O, up to 0.10 percent Fe, up to 0.10 percent C+N, and up to 0.005 percent H, with the remainder being Ti and unavoidable impurities, said titanium exhibiting mechanical properties and fracture toughness of base metal and welded portions which meet the requirements for use as titanium for conductor conduit in superconducting coil.

2 Claims, 3 Drawing Sheets

TITANIUM FOR CONDUCTOR CONDUIT IN SUPERCONDUCTING COIL

BACKGROUND OF THE INVENTION

1. Field of the Invention

The present invention relates to large-current superconducting wire material for use in nuclear fusion reactors, energy storage apparatuses and other such devices.

2. Description of the Prior Art

In the prior art there is used forced cooled type multi-filament superconducting wire formed of stabilizer and several hundred superconductor filaments twisted together, with each filament being about one millimeter in diameter, arranged inside stainless steel conduit pipe.

When the superconductor is $Nb_3Sn$ or an alloy of $Nb_3Sn$, a problem is that the critical current density of the superconductor is degraded to some 20 to 40 percent below that of the multi-filament superconducting wire of $Nb_3Sn$ or $Nb_3Sn$ alloy. It is considered that this may be the result of compressive strain on the $Nb_3Sn$ arising from the difference between the thermal shrinkage factors of the $Nb_3Sn$ and the stainless steel.

One possible solution is to use, as the conduit material, a nickel alloy such as Incoloy 908 that has substantially the same thermal shrinkage factor as $Nb_3Sn$, and a high tensile strength at the temperature of liquid helium (hereinafter referred to as "4K"). However, because such alloys are ferromagnetic and also have problems with respect to corrosion-resistance, they have not yet been applied as a conduit material.

Titanium (pure titanium and titanium alloy) is a non-magnetic, highly corrosion-resistant material with a thermal shrinkage factor which is close to that of $Nb_3Sn$, and its excellent balance of strength and toughness at very low temperatures makes it an excellent prospect as a material for conductor conduit in superconducting coil.

SUMMARY OF THE INVENTION

The object of this invention is to provide a superconductor that resolves the problem of the degradation in the critical current density of superconductors that use $Nb_3Sn$ or $Nb_3Sn$ alloy, and possesses good mechanical properties as well as good fracture toughness.

BRIEF DESCRIPTION OF THE DRAWINGS

The objects and features of the present invention will become more apparent from a consideration of the following detailed description taken in conjunction with the accompanying drawings in which.

DETAILED DESCRIPTION OF THE INVENTION

Figure 1:
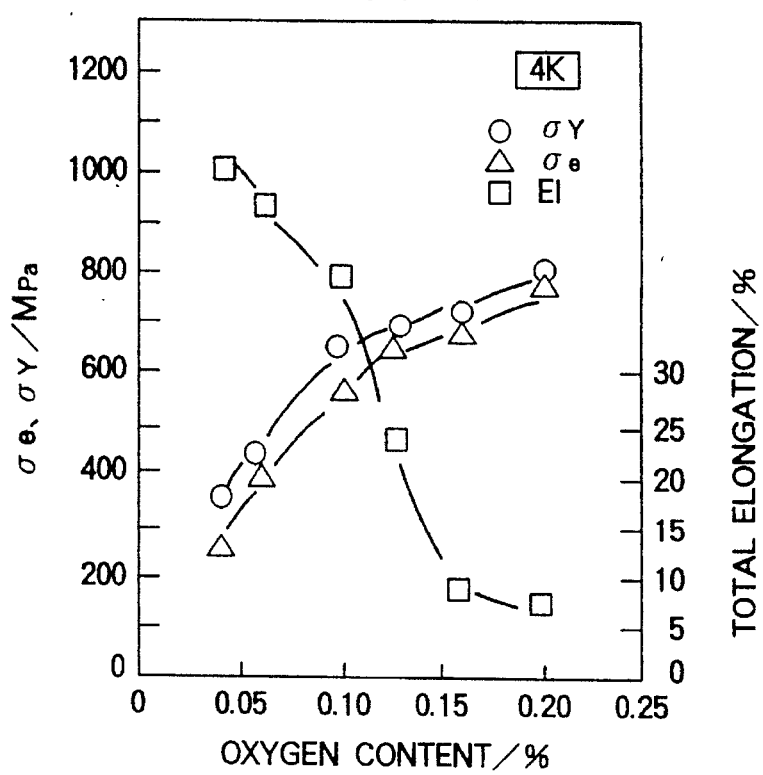
FIG. 1 is a graph showing the relationship between the oxygen content of titanium at 4K, and its tensile properties.

The titanium for conductor conduit in superconducting coil produced in accordance with this invention comprises, in mass % 0.07 to 0.13 percent O, up to 0.10 percent Fe, up to 0.10 percent C+N, and up to 0.005 percent H, with the remainder being Ti and unavoidable impurities, said titanium exhibiting good mechanical properties, corrosion-resistance and thermal shrinkage properties of base metal and welded portions at 4K.

Conduit pipe material for superconducting wire used in nuclear fusion reactors and other such large-current applications is generally required to have the following properties: (1) the same thermal shrinkage factor as that of $Nb_3Sn$, (2) non-magnetic, (3) corrosion-resistance, (4) high strength, high toughness and reliability at 4K, (5) weldability (defect-free welded portions, welded portions that have the same mechanical qualities as those of the base metal), and (6) bendability (low strength at room temperature).

After establishing what the problems were with the prior art technology and what needed to be solved, the present inventors carried out various investigations relating to a material that could satisfy all of the above requirements for a conduit pipe material. This led the inventors to focus on titanium. That is, with respect to the above items (1), (2) and (3), titanium equals or is superior to the materials used in the prior art (stainless steel, nickel alloy). Studies were then carried out relating to components for a titanium to meet the requirements of items (4), (5) and (6), based on a specific consideration of the values required for superconducting wire.

With respect first to bendability at room temperature and weldability, the inventors thought that compared to titanium alloy, which has a high tensile strength and in which heat treatment produces large changes, pure titanium, with its low strength at room temperature and small material difference between welded portions and base metal portions, is a better material for conduit pipe. Also, after studying specific numerical values for the strength, ductility and toughness requirements for conduit pipe applications, the inventors prescribed the following limits with respect to mechanical properties at 4K.

| Proportional limit | $\sigma E \geq 400$ MPa |
| --- | --- |
| Yield strength | $\sigma Y \geq 550$ MPa |
|  | $\sigma U/\sigma Y \geq 1.3$ |
| Elongation | $El \geq 10\%$ |
|  | $K_{1c} \geq 100$ MPa·$m^{-1/2}$ |
|  | $uE \geq 30$ J |

The above limits relating to properties were prescribed based on the following factors. The proportional limit is the limit of the strain that will not degrade the properties of the $Nb_3Sn$, the yield strength is based on the required conductor bearing power at 4K, the yield ratio limit is derived from the degree of work hardenability at 4K required in a structural material, and the fracture toughness and Charpy impact test value limits are to avoid brittle fracture at 4K. As the manufacture of conduit pipe requires cold working at room temperature, a lower yield strength at room temperature is more advantageous. Also, the properties of welded portions have to be close to those of the base metal.

Next the inventors carried out a systematic investigation of the relationship between trace elements (impurities) in pure titanium and annealing conditions, and tensile properties and fracture toughness. This revealed that conditions satisfying the above limits on properties could be obtained by suitably controlling these trace elements, and the conclusion was reached that pure titanium is an ideal conduit material that satisfies all of the above items (1) to (6). Impurities, particularly oxygen, have a major effect on the tensile characteristics of pure titanium at room temperature; the oxygen content is known to improve the tensile strength.

Figure 2:
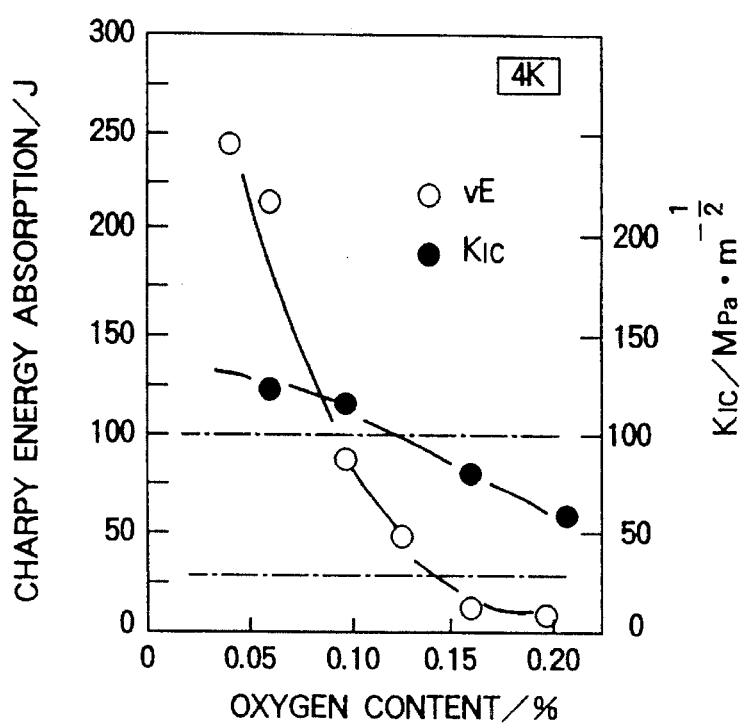
FIG. 2 is a graph showing the relationship between the oxygen content of titanium at 4K, Charpy energy absorption value and $K_{10}$ value.
Figure 3A:
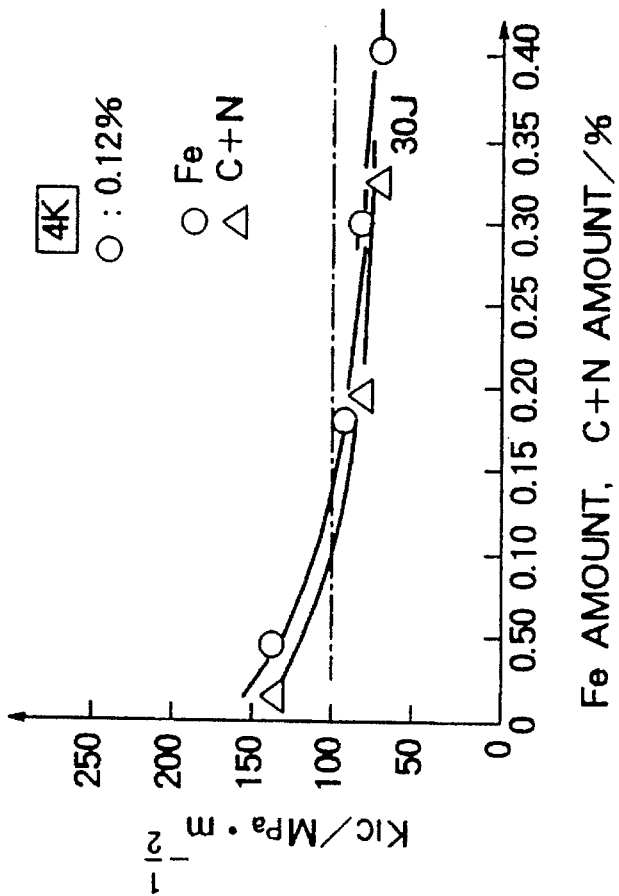
FIGS. 3a and 3b are graphs showing the relationship between content amounts of impurities other than oxygen, and fracture toughness ($K_{10}$ value and Charpy energy absorption value)
Figure 3B:
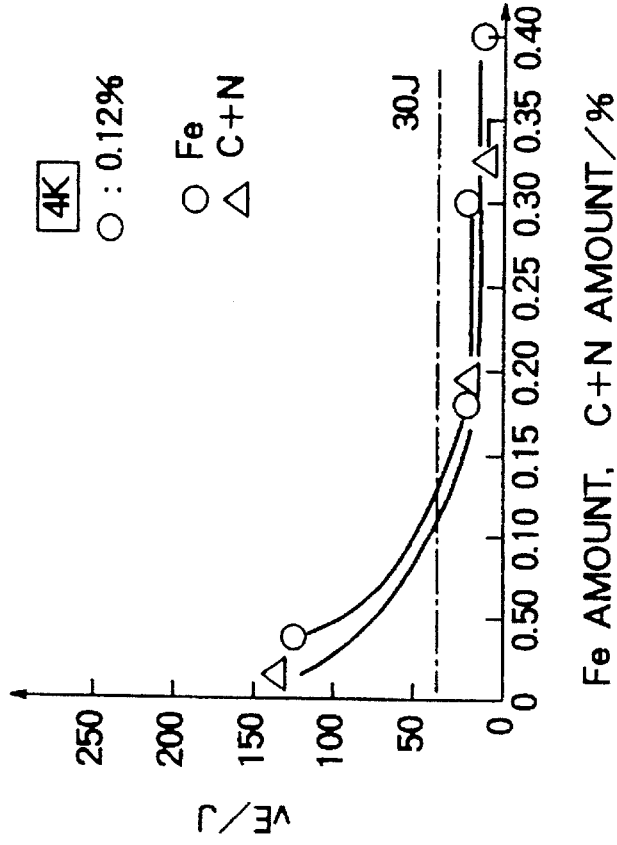

FIG. 1 shows the yield strength (0.2% bearing force) of base metal and joints at 4K plotted against oxygen content. It was found that at 4K, too, an increase in the oxygen content produces a corresponding increase in the yield strength (0.2% bearing force) but a decrease in elongation, to substantially the same as at room temperature. FIG. 2 shows the relationship between oxygen content, and Charpy impact test value and $K_{1C}$ value. It was found that, in contrast to tensile strength, Charpy impact test values and $K_{1C}$ values decrease when the oxygen content is increased. With reference to FIG. 3, showing the relationship between content amounts of impurities other than oxygen, and fracture toughness ($K_{1C}$ value) at 4K, it can be seen that fracture toughness decreases when the impurity content is increased.

Figure 4:
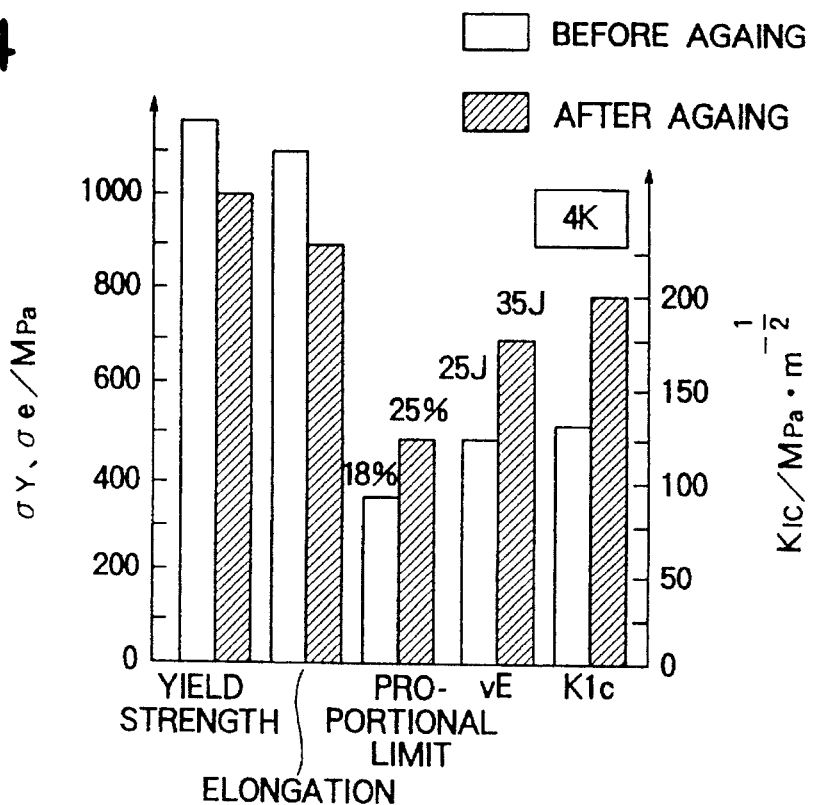
FIG. 4 is a graph showing the degree of change in the tensile properties and fracture toughness at 4K of titanium subjected to aging treatment.

After being formed into pipe, the $Nb_3Sn$ superconductor conduit is subjected to a final aging treatment for alloying. It was found that the strength at room temperature and at 4K varied considerably depending on the aging conditions used. As an example, FIG. 4 shows changes in the mechanical properties at 4K of pure titanium subjected to normal $Nb_3Sn$ alloying conditions of 700° C. for 100 hours. With the addition of aging treatment, there is a marked degradation in tensile strength, while on the other hand elongation and fracture toughness is improved. Therefore, in order to ensure the strength of the material at 4K, when deciding on the chemical composition and aging conditions it is necessary to take into full account the degree of degradation in strength caused by the aging treatment.

Figure 5:
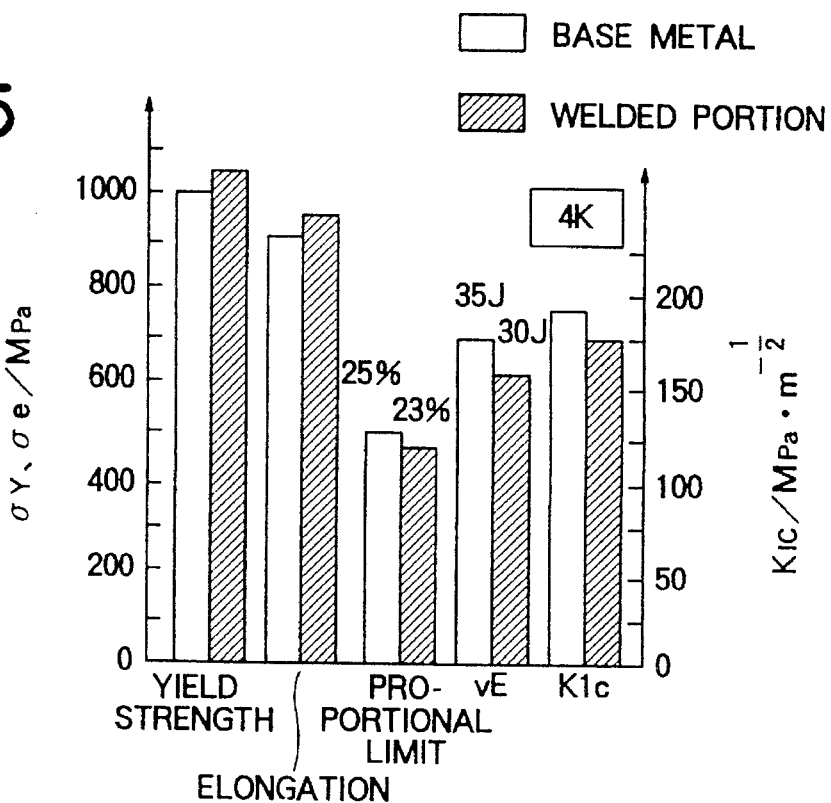
FIG. 5 is a graph showing the mechanical properties, at 4K, of base metal portions compared with welded portions of titanium.

As mentioned, however, the properties of welded portions at room temperature and 4K are required to be on a par with those of the base metal. A merit that pure titanium has over titanium alloy is that, if adequate shielding is used during welding, the heat treatment produces less change in its texture and, therefore, less change in its mechanical properties. FIG. 5 shows an example of a comparison between the (prior to aging treatment) mechanical properties, at 4K, of pure titanium base metal portions and welded portions welded by the highly reliable TIG process. Although the TIG-welded portions have a slightly higher tensile strength and lower elongation and fracture toughness, the differences relative to the base metal portion are very small. In specifying the component limits of the invention, the above facts were taken into full account on an overall basis.

As indicated by FIG. 1, at room temperature and 4K oxygen increases the proportional limit and yield strength, and decreases elongation fracture toughness. Oxygen is an interstitial solid solution element that increases the internal stress and the strength of the material. At the same time, to change the deformation mode, ultralow temperature fracture toughness is markedly decreased (FIG. 2). With an oxygen content of less than 0.07 percent the proportional limit is not enough to eliminate degradation in the $Nb_3Sn$ properties and yield strength at 4K. With a content that exceeds 0.13 percent, at 4K elongation does not exceed 10 percent and fracture toughness $K_{1C}$ does not exceed 100 MPa·m$^{-1/2}$, making it difficult to ensure structural reliability and avoid brittle fracture.

Iron is second only to oxygen in terms of content amount. Increasing the iron content decreases fracture toughness and also tends to reduce corrosion-resistance. If there is more than 0.10 percent iron, the prescribed Charpy impact test and $K_{1C}$ values will not be attained.

As is the case with oxygen, fracture toughness is affected by the carbon plus nitrogen (C+N) content; specifically, increasing the C+N content produces a pronounced degradation in fracture toughness. If the content exceeds 0.10 percent, the prescribed Charpy impact test and fracture toughness values will not be attained.

In addition to reducing the fracture toughness at 4K, an increase in the hydrogen content produces hydrides, giving rise to hydrogen embrittlement and markedly degrading cold workability. Hence a hydrogen content not exceeding 0.005 percent has been specified.

EXAMPLES

The properties of base metal portions and welded portions at room temperature and at 4K were investigated in respect of materials having the composition according to this invention and materials having other compositions. Chemical compositions, heat treatment conditions and welding conditions are listed in Table 1 and Table 2. In Table 1, (1) is a material according to this invention while (2) to (5) are examples Of materials with an oxygen or other impurity content that is not within the limits prescribed according to the invention.

A consumable electrode type vacuum arc furnace was used to prepare melts of titanium having the chemical composition listed in Table 1, and these were hot-rolled and cold-rolled to sheets 1 mm thick, which were annealed. These sheets were then used to prepare butt-welded joints using the welding conditions of Table 2, which were subjected to aging treatment (700° C.×100 h→air cooled) to simulate the treatment for alloying of $Nb_3Sn$. Table 3 lists the tensile and brittle toughness properties of the base metal and welded portions of these sheets, at room temperature and at 4K.

TABLE 1

| | Chemical Composition (mass %) | | | | | Yield strength (0.29% PS) |
|---|---|---|---|---|---|---|
| | O | N | Fe | C | H | MPa |
| ① Invention | 0.10 | 0.01 | 0.05 | 0.01 | 0.0018 | 294 |
| ② Comparative | 0.17 | 0.02 | 0.04 | 0.01 | 0.0013 | 353 |
| ③ Comparative | 0.06 | 0.01 | 0.03 | 0.01 | 0.0015 | 217 |
| ④ Comparative | 0.12 | 0.01 | 0.30 | 0.01 | 0.0020 | 323 |
| ⑤ Comparative | 0.11 | 0.08 | 0.04 | 0.09 | 0.0012 | 338 |

TABLE 2

| | Welding Conditions |
|---|---|
| Welding Technique | TIG |
| Current (A) | 305 |
| Voltage (V) | 14 |
| Velocity (cm/min) | 35 |

TABLE 3

|  |  | $\sigma_U$ (MPa) | $\sigma_Y$ (MPa) | El (%) | $\sigma_E$ (MPa) | $\sigma_{U/\sigma Y}$ | $K_{IC}$ MPa·m$^{-1/2}$ | CVN (J) |
|---|---|---|---|---|---|---|---|---|
|  | Range | — | ≧550 | ≧10 | ≧400 | ≧1.3 | ≧100 | ≧30 |
| ① | Base metal | 1010 | 605 | 40 | 550 | 1.7 | 120 | 80 |
|  | Welded joint portion | 998 | 568 | 32 | 544 | 1.8 | 112 | 75 |
| ② | Base metal | 1769 | 715 | 9 | 677 | 2.4 | 87 | 11 |
|  | Welded joint portion | 1794 | 702 | 8 | 661 | 2.6 | 81 | 10 |
| ③ | Base metal | 955 | 442 | 48 | 394 | 2.2 | 134 | 226 |
| ④ | Base metal | 1240 | 650 | 32 | 590 | 1.9 | 91 | 26 |
| ⑤ | Base metal | 1350 | 678 | 29 | 611 | 2.0 | 87 | 21 |

* Aging Conditions: 700° C. × 100 h → air cooled

Sheets 2.5 mm thick were prepared separately as test specimens for tensile tests and Charpy impact tests, which were carried out with the sheets overlaid. Plate 15 mm thick was prepared for fracture toughness testing. Bending tests were conducted on three specimens, each measuring 10 by 20 by 100 mm, prepared from the central part of a sheet.

The base metal and welded portions of high-oxygen material specimen (2) both satisfied the prescribed tensile strength values, but elongation and Charpy impact test values were outside the prescribed ranges. With its low tensile strength at room temperature, the low-oxygen specimen (3) had good workability but did not exhibit the prescribed yield strength at 4K. Specimen (4), a high-iron impurity material, exhibited insufficient Charpy impact test and $K_{1C}$ values, and a similar tendency was observed in specimen (5), a material with high carbon and nitrogen. In the case of the inventive material, however, the proportional limits at 4K of the base metal and welded portions, and all other properties, were within the prescribed limits.

Thus, it was possible to confirm that the conduit pipe material of the present invention has mechanical properties at 4K that fully satisfy prescribed requirements.

INDUSTRIAL USABILITY

The titanium for conductor conduit in superconducting coil provided by the present invention can be used as large-current conduit in nuclear fusion reactors, energy storage apparatuses and other such devices. In addition to preventing degradation of the properties of superconducting wire, the titanium material of the invention exhibits markedly superior mechanical properties at 4K, fracture toughness, corrosion resistance, weldability and bendability at room temperatures.

What is claimed is:

1. Titanium for conductor conduit in superconducting coil, consisting of, in mass % 0.07 to 0.13 percent oxygen, up to 0.10 percent iron, up to 0.10 percent carbon+nitrogen, and up to 0.005 percent hydrogen, with the remainder being titanium and unavoidable impurities, wherein base metal and welded portions of said titanium exhibit little difference in material properties, and at liquid helium temperature of 4K the base metal exhibits mechanical properties within the following ranges:

| Proportional limit | $\sigma_E$ ≧ 400 MPa |
| Yield strength | $\sigma_Y$ ≧ 550 MPa |
|  | $\sigma_U/\sigma_Y$ ≧ 1.3 |
| Elongation | El ≧ 10% |
|  | $K_{IC}$ ≧ 100 MPa·m$^{-1/2}$ |
|  | uE ≧ 30 J. |

2. The titanium according to claim 1, consisting of, in mass % 0.10 percent oxygen, 0.05 percent iron, 0.02 percent carbon+nitrogen, and 0.0018 percent hydrogen, with the remainder being titanium and unavoidable impurities.

* * * * *